(12) United States Patent
Graham et al.

(10) Patent No.: US 10,160,632 B2
(45) Date of Patent: Dec. 25, 2018

(54) SYSTEM AND METHOD FOR FORMING A BURIED LOWER ELECTRODE IN CONJUNCTION WITH AN ENCAPSULATED MEMS DEVICE

(71) Applicant: Robert Bosch GmbH, Stuttgart (DE)

(72) Inventors: Andrew Graham, Redwood City, CA (US); Ando Feyh, Palo Alto, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 1152 days.

(21) Appl. No.: 13/969,522

(22) Filed: Aug. 17, 2013

(65) Prior Publication Data

US 2014/0054730 A1 Feb. 27, 2014

Related U.S. Application Data

(60) Provisional application No. 61/691,662, filed on Aug. 21, 2012.

(51) Int. Cl.
*B81B 3/00* (2006.01)
*B81C 1/00* (2006.01)
*B81B 7/00* (2006.01)

(52) U.S. Cl.
CPC ............ *B81B 3/0021* (2013.01); *B81B 7/007* (2013.01); *B81C 1/00015* (2013.01); *B81B 2207/092* (2013.01); *B81B 2207/095* (2013.01)

(58) Field of Classification Search
CPC ........... H01L 2924/1461; H01L 41/113; H01L 41/1132; H01L 41/1134; H01L 41/1136;
(Continued)

(56) References Cited

U.S. PATENT DOCUMENTS 6,158,280 A 12/2000 Nonomura et al.
6,664,126 B1 12/2003 Devoe et al.
(Continued)

FOREIGN PATENT DOCUMENTS

CN 1577856 A 2/2005
CN 1964044 A 5/2007
(Continued)

OTHER PUBLICATIONS

Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).
(Continued)

*Primary Examiner* — Sue A Purvis
*Assistant Examiner* — Suberr Chi
(74) *Attorney, Agent, or Firm* — Maginot Moore & Beck LLP

(57) ABSTRACT

A system and method for forming a sensor device with a buried first electrode includes providing a first silicon portion with an electrode layer and a second silicon portion with a device layer. The first silicon portion and the second silicon portion are adjoined along a common oxide layer formed on the electrode layer of the first silicon portion and the device layer of the second silicon portion. The resulting multi-silicon stack includes a buried lower electrode that is further defined by a buried oxide layer, a highly-doped ion implanted region, or a combination thereof. The multi-silicon stack has a plurality of silicon layers and silicon dioxide layers with electrically isolated regions in each layer allowing for both the lower electrode and an upper electrode. The multi-silicon stack further includes a spacer that enables the lower electrode to be accessible from a topside of the sensor device.

18 Claims, 7 Drawing Sheets

(58) Field of Classification Search
CPC ........... H01L 41/1138; H01L 27/14687; H01L 27/14632; B81B 3/0021; B81B 7/007
USPC .................................................. 257/415–419
See application file for complete search history.

(56) References Cited

U.S. PATENT DOCUMENTS

| | | | |
|---|---|---|---|
| 6,913,941 | B2 | 7/2005 | O'Brien et al. |
| 7,056,757 | B2 | 6/2006 | Ayazi et al. |
| 7,825,484 | B2 | 11/2010 | Martin et al. |
| 2001/0038148 | A1 | 11/2001 | Mastromatteo et al. |
| 2010/0032775 | A1 | 2/2010 | Morris, III et al. |
| 2010/0295138 | A1 | 11/2010 | Montanya Silvestre et al. |
| 2011/0133295 | A1* | 6/2011 | Fujii .................... G01P 15/0802 257/415 |
| 2011/0278568 | A1* | 11/2011 | Pagani .................... H01L 24/05 257/48 |
| 2012/0187508 | A1* | 7/2012 | Adler .................... B06B 1/0292 257/416 |
| 2012/0261822 | A1 | 10/2012 | Graham et al. |

FOREIGN PATENT DOCUMENTS

| | | |
|---|---|---|
| CN | 100339738 C | 9/2007 |
| CN | 101953174 A | 1/2011 |
| CN | 102602877 A | 7/2012 |
| DE | 102010062555 A1 | 6/2012 |
| JP | 2011139018 A | 7/2011 |
| TW | I253436 B | 4/2006 |
| WO | 2007135682 A2 | 11/2007 |

OTHER PUBLICATIONS

Chen et al., "An Integrated Solution for Wafer-Level Packaging and Electrostatic Actuation of Out-of-Plane Devices," Paper from Stanford University, 2009, pp. 1071-1074, IEEE, USA (4 pages).
Chen, "Electrode Integrated Wafer-Level Packaging for Out-of-Plane MEMS Devices," Abstract Preview, International Microelectronics and Packaging Society, 2009, USA (1 pages).
Hyldgård et al., "Fish & Chips: Single Chip Silicon MEMS CTDL Salinity, Temperature, Pressure and Light Sensor for Use in Fisheries Research," Sensors, 2005, IEEE, pp. 1124-1127 (4 pages).
Park et al., "Untraminiature encapsulated accelerometers as a fully implantable sensor for implantable hearing aids," Biomed Microdevices, 2007, Springer, USA (11 pages).
Web site publication, "Encapsulation for RF MEMS," http://micromachine.stanford.edu/~kuanlinc/Professional/Encapsulation%20for20%RF%20 . . . Downloaded Apr. 1, 2011, (4 pages).
International Search Report and Written Opinion corresponding to PCT Application No. PCT/US2013/055668, dated Nov. 29, 2013 (8 pages).
Chinese Search Report and Written Opinion corresponding to Chinese Application No. 201380048541.5 (6 pages).
English Translation of Official Letter corresponding to Taiwan Patent Application No. 102130179 (6 pages).
English Translation of Notice of Reason for Rejection corresponding to Japanese Patent Application No. 2015-528561 (8 pages).

* cited by examiner

SYSTEM AND METHOD FOR FORMING A BURIED LOWER ELECTRODE IN CONJUNCTION WITH AN ENCAPSULATED MEMS DEVICE

This application claims the benefit of U.S. Provisional Application No. 61/691,662, filed Aug. 21, 2012.

FIELD OF THE INVENTION

The present disclosure relates to capacitive micro electrical mechanical system (MEMS) devices.

BACKGROUND

For many capacitive MEMS devices, the use of electrodes above and below the device structure is either required for the basic operation of the device or greatly enhances the performance of the device. One or more of the electrodes are typically formed by deposition of a conductive film, electrical isolation of a conductive layer, or by simply adding a spacer layer between two conductive materials.

The electrode configuration of such a capacitive MEMS device allows for closed-loop operation in which the device is held fixed in place by electrostatic forces or for differential sensing of an open-loop measurement of the device. Many encapsulation methods used to produce capacitive MEMS devices, however, either do not allow for an arbitrary placement of one or both of the upper and lower electrodes or do not allow for any such out-of-plane electrodes.

SUMMARY

In accordance with one embodiment, a method of forming a MEMS device includes defining a first electrode in a silicon on insulator (SOI) wafer, forming a second electrode in a first layer located above an upper surface of the SOI wafer, forming a third electrode in a second layer located above an upper surface of the first layer, forming a first contact above the second layer in electrical communication with the first electrode through the second layer and the first layer, forming a second contact above the second layer in electrical communication with the second electrode through the second layer, and defining a third contact above the second layer in electrical communication with the third.

In another embodiment, a MEMS device includes a first electrode in a silicon on insulator (SOI) wafer, a second electrode in a first layer located above an upper surface of the SOI wafer, a third electrode in a second layer located above an upper surface of the first layer, a first contact above the second layer in electrical communication with the first electrode through the second layer and the first layer, a second contact above the second layer in electrical communication with the second electrode through the second layer, and a third contact above the second layer in electrical communication with the third electrode.

DESCRIPTION

Figure 1:
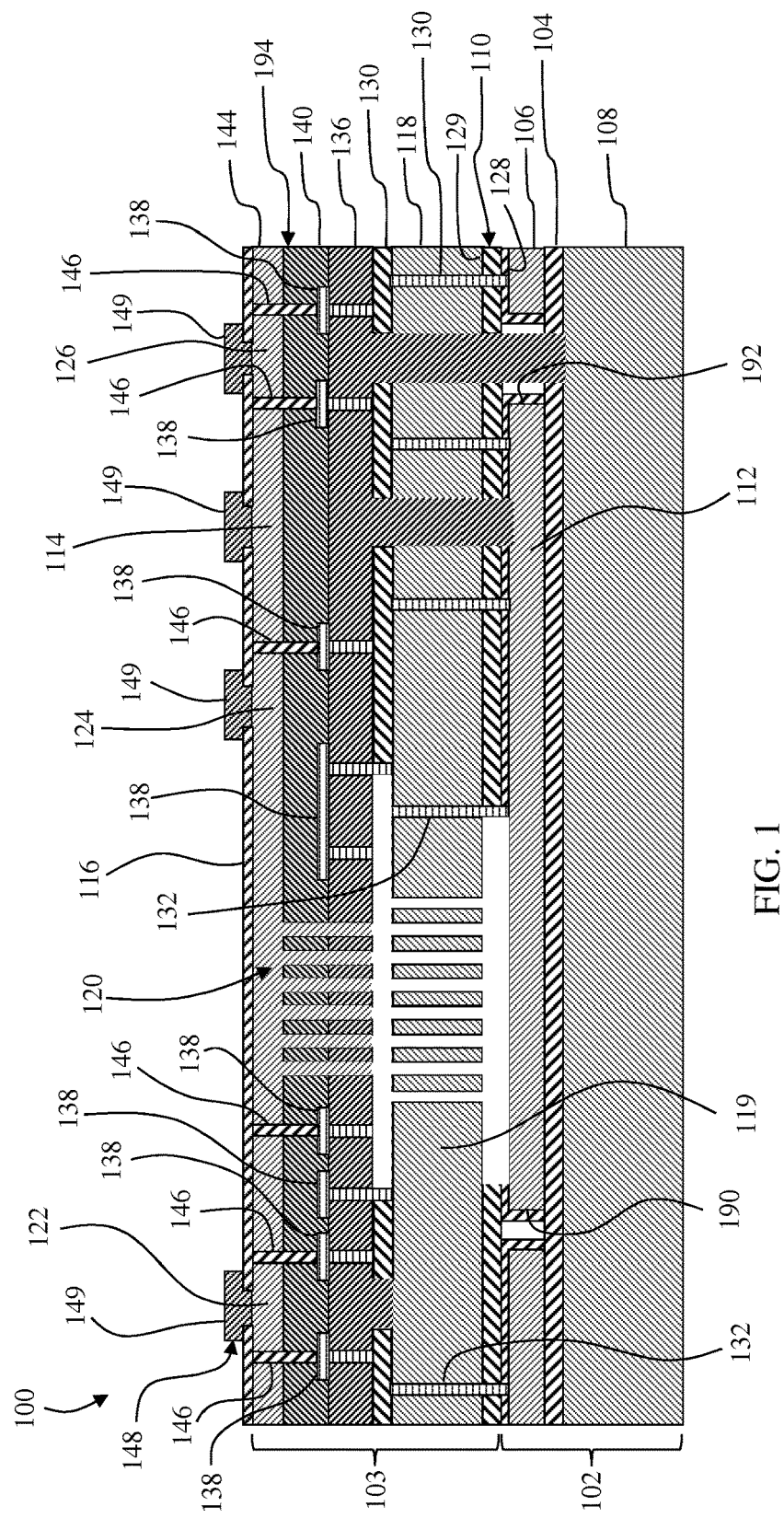
FIG. 1 depicts a side cross-sectional view of a sensor device incorporating a plurality of electrodes electrically connected to a top side of the sensor device via respective corresponding contacts.

For the purpose of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

In many of these embodiments, a MEMS sensor may be used to sense a physical condition such as acceleration, pressure, or temperature, and to provide an electrical signal representative of the sensed physical condition. The embodiments may be implemented in or associated with a variety of applications such as automotives, home appliances, laptops, handheld or portable computers, mobile telephones, smart phones, wireless devices, tablets, personal data assistants (PDAs), MP3 players, camera, GPS receivers or navigation systems, electronic reading displays, projectors, cockpit controls, game consoles, earpieces, headsets, hearing aids, wearable display devices, security systems, and etc.

FIG. 1 depicts a sensor device 100 that includes a first silicon portion 102 and a second silicon portion 103 that is adjacent to the first silicon portion 102. A first buried oxide layer 104 is positioned within the first silicon portion 102 to separate the first silicon portion 102 into a silicon layer 106 and a substrate layer 108. A first oxide layer 110 is positioned between the silicon layer 106 and the second silicon portion 103 to define a first electrode 112.

The positioning of the first buried oxide layer 104 and the first oxide layer 110 electrically isolates the first electrode 112 from the first silicon portion 102 and enables electrical isolation of the first electrode 112 from portions of the second silicon portion 103. A vertical electrical interconnect or first contact 114 is used to provide electrically isolated access to the first electrode 112 from a topside 116 of the sensor 100.

The second silicon portion 103 includes a first layer 118 with a second electrode 119 defined therein and a second layer 194 with a third electrode 120 defined therein. In the embodiment shown, the first layer 118 includes a functional device that has a deformable portion configured to move or deform relative to the electrodes in response to an applied force. A second contact 122, a third contact 124, and a fourth contact 126 are incorporated within the second silicon portion 103 to provide electrically isolated access to the second electrode 119, the third electrode 120, and the substrate layer 108, respectively, from the topside 116 of the sensor 100.

Figure 2:
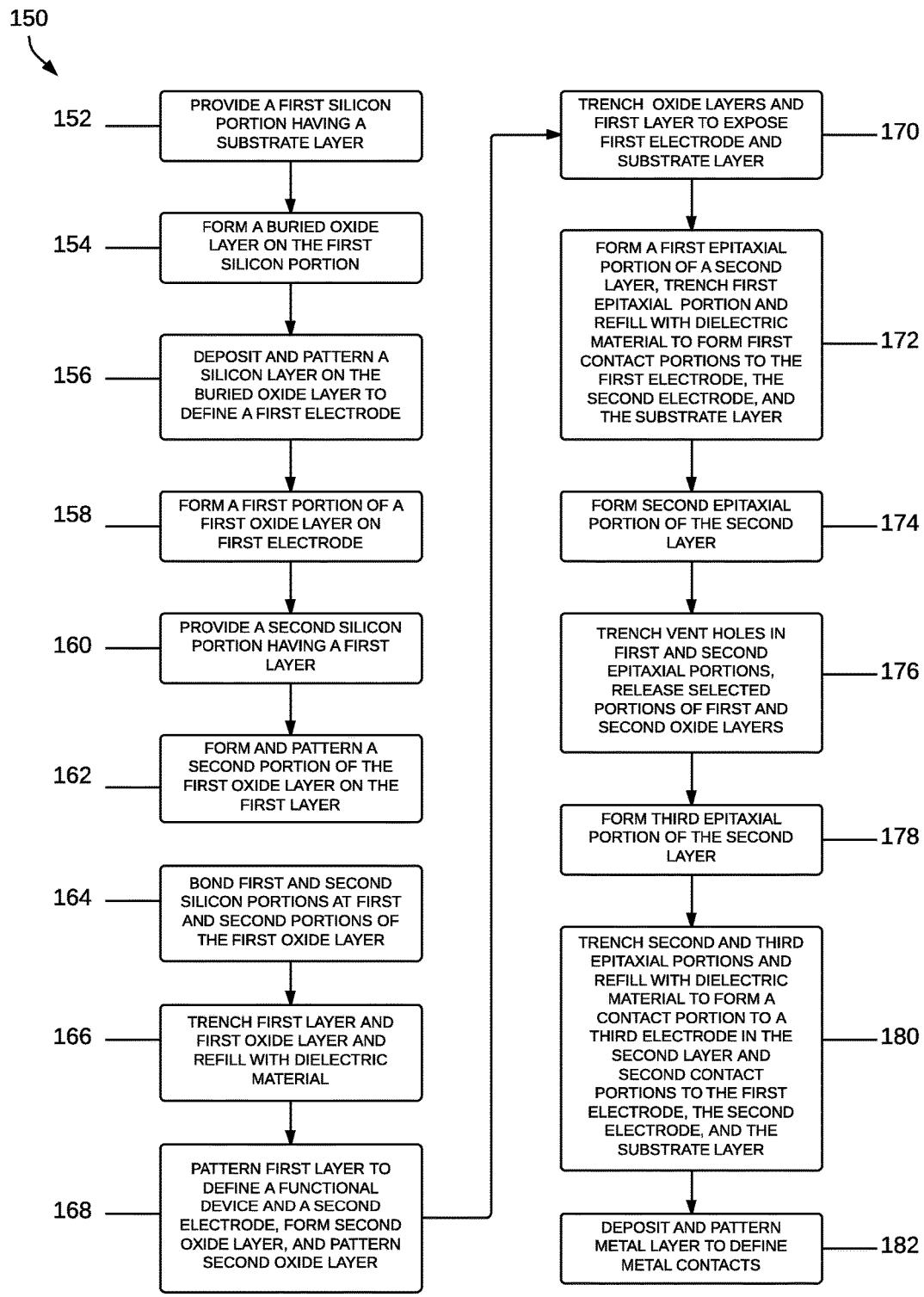
FIG. 2 depicts a process for forming the sensor device of FIG. 1.

A process 150 for forming a substrate configuration that is used in a sensor, such as the sensor device 100, is discussed with reference to FIG. 2. Initially, a first silicon portion 102 is provided for further processing (block 152). In one embodiment, the first silicon portion 102 is a wafer that is processed to form a silicon layer 106 and a substrate layer 108 that are electrically isolated from one another. In this embodiment, a first buried oxide layer 104 is formed on a surface of the first silicon portion 102 (block 154). The first buried oxide layer 104 can be a top layer of silicon dioxide that is grown by the technique of thermal oxidation, in which the first silicon portion 102 is exposed to oxygen and/or steam.

A layer of silicon is deposited on the first buried oxide layer 104 of the first silicon portion 102 to form a silicon layer 106, which is then patterned to define a first electrode 112 (block 156). The silicon layer 106 is deposited by chemical vapor deposition (CVD) or, more particularly, low pressure chemical vapor deposition (LPCVD), it can also be deposited via epitaxial layer growth or using a silicon wafer-bond with a back-grind process. In one embodiment, the silicon layer 106 is deposited to a thickness of approximately 0.1 to 3 μm. The patterning of the silicon layer 106 forms a first first electrode trench 190 and a second first electrode trench 192 that bound the first electrode 112. The silicon layer 106 can be patterned by any process that enables the transfer of a pattern into a material.

A first portion 128 of a first oxide layer 110 is formed on the deposited and patterned silicon layer 106 to provide appropriate electrical isolation of the first electrode 112 in accordance with the principles of the disclosure (block 158). The first portion 128 of the first oxide layer 110 can be grown by thermal oxidation or deposited by a known deposition process. Optionally, the first portion 128 of the first oxide layer 110 can be smoothed using a polishing process, such as chemical mechanical polishing/planarization (CMP).

In one embodiment, the first silicon portion 102 is a silicon-on-insulator (SOI) wafer, which is provided with a silicon layer 106 and a substrate layer 108 already separated by a buried oxide layer. In this embodiment, the silicon layer 106 is patterned and the first portion 128 of the first oxide layer 110 is formed on the silicon layer 106 to provide appropriate electrical isolation of the first electrode 112.

Additionally, a second silicon portion 103 is provided for further processing (block 160). The second silicon portion 103 can be provided as a blank wafer or as a SOI wafer. In at least one embodiment, the second silicon portion 103 has a first layer 118 with a thickness of approximately 10 to 40 μm. The second silicon portion 103 is processed by forming a second portion 129 of the first oxide layer 110 on the first layer 118 and patterning the second portion 129 of the first oxide layer 110 (block 162). Similar to the buried oxide layer 104 and the first portion 128 of the first oxide layer 110, the second portion 129 of the first oxide layer 110 can be a silicon dioxide layer grown by thermal oxidation.

A multi-silicon stack is formed by wafer bonding the first and second silicon portions 102, 103 to one another at the first and second portions 128, 129 of the first oxide layer 110 (block 164). Prior to wafer bonding, the first and second silicon portions 102, 103 are positioned relative to one another such that at least some of the patterning of the first silicon portion 102 aligns with the patterning of the second silicon portion 103 when the first and second portions 128, 129 of the first oxide layer 110 are adjacent. This positioning enables the formation of a first contact 114 and a fourth contact 126, which connect the first electrode 112 and the substrate layer 108, respectively, to a topside 116 of the sensor 100. The wafer bonding of the first and second silicon portions 102, 103 can be accomplished by any wafer bonding technique. The surface of the second silicon portion 103 opposite the bonded region can be background to produce a desired thickness of the first layer 118 or of the sensor device 100.

In at least one embodiment, starting from the processed first silicon portion 102 at block 158, a polysilicon layer can be grown from the first silicon portion 102 to achieve the same substrate configuration produced at block 164. This embodiment, however, does not allow for a top layer of the final substrate configuration to be of single crystal silicon.

First trenches 132 are etched into the first layer 118 and the first and second portions 128, 129 of the first oxide layer 110. The first trenches 132 are then refilled with a dielectric material, such as silicon nitride, to provide electrical isolation between selected portions of the first layer 118 (block 166), and to provide a lateral etch-stop during the oxide release etching. The trenches can be etched and refilled by any desired process. In some embodiments, the trenches are etched and refilled using methods generally described in U.S. patent application Ser. Nos. 13/232,005 and 13/767,594, the entire contents of which are herein incorporated by reference.

At block 168, the first layer 118 is patterned, a second oxide layer 130 is formed on the patterned first layer 118, and the second oxide layer 130 is patterned (block 168). The patterning of the first layer 118 and the forming of the second oxide layer 130 are conformal in one embodiment. In another embodiment, the patterning of the first layer 118 and the forming of the second oxide layer 130 are non-conformal. The patterning of the second oxide layer 130 is used in the formation of the first contact 114, the fourth contact 126, and a second contact 122, which connect the first electrode 112, the substrate layer 108, and the first layer 118, respectively, to the topside 116 of the sensor 100. After the second oxide layer 130 is patterned (block 168), selected portions of the first layer 118 are etched with an additional photomask to form second trenches 134 (FIG. 8) that extend into the first electrode 112 and the substrate layer 108 (block 170).

A first epitaxial portion 136 of the second layer 194 is formed that covers the exposed first layer 118 and the second oxide layer 130 and fills the second trenches 134 formed at block 170 (block 172). In one embodiment, the first epitaxial portion 136 is polished by using the CMP process. Also at block 172, third trenches 138 are etched into the first epitaxial portion 136 and, in some cases, into the second oxide layer 130. The third trenches 138 are subsequently refilled with a dielectric material, such as silicon nitride, which is then patterned.

A second epitaxial portion 140 of the second layer 194 is formed over both the first epitaxial portion 136 and the patterned dielectric material adjacent to the first epitaxial portion 136 (block 174). The second epitaxial portion 140 is smoothed using a polishing process, such as CMP. Vent holes 142 are etched into the first and second epitaxial portions 136, 140 to expose the second oxide layer 130 (block 176). Selected portions of the first and second oxide layers 110, 130 are then release etched at block 176 using a vapor phase hydrofluoric acid (HF) process.

A third epitaxial portion 144 of the second layer 194 is formed over the second epitaxial portion 140 to seal the resulting substrate configuration (block 178). The third epitaxial portion 144 is smoothed using a polishing process, such as CMP. Fourth trenches 146 are etched into the second and third epitaxial portions 140, 144 and intersect with selected third trenches 138, which have been previously refilled with dielectric material (block 180). The fourth trenches 146 are refilled with dielectric material, such as silicon nitride, and then patterned. A metal layer 148 is deposited over both the patterned dielectric material adjacent to the third epitaxial portion 144 and the exposed portions of the third epitaxial portion 144 (block 182). The metal layer 148 is then patterned to form electrically isolated metal contacts 149 operatively associated with the second contact 122, the third contact 124, the first contact 114, and the fourth contact 126.

Figure 3:
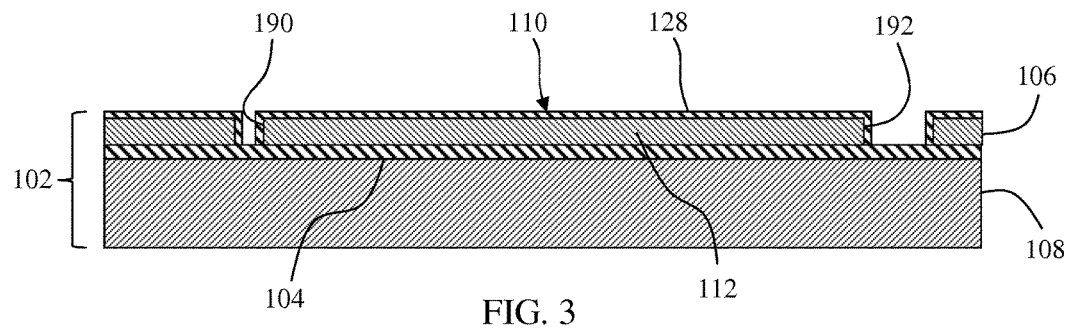
FIG. 3 depicts a side cross-sectional view of a silicon on insulator (SOI) wafer provided in accordance with the process of FIG. 2.
Figure 4:
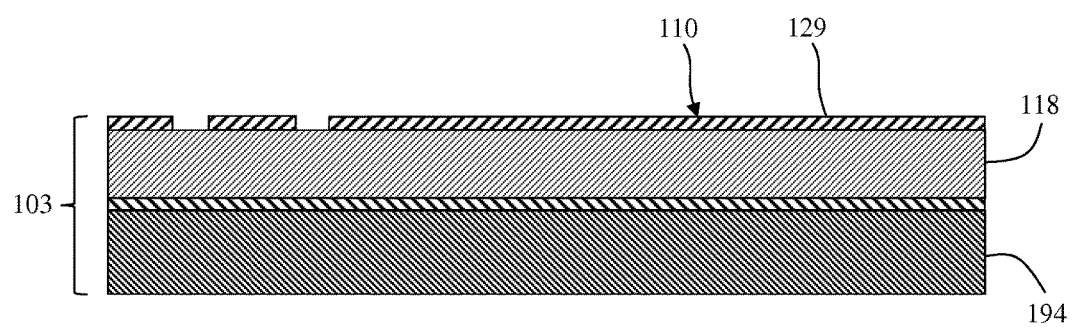
FIG. 4 depicts a side cross-sectional view of a second SOI wafer provided in accordance with the process of FIG. 2.

As shown in FIG. 1, the third electrode 120 is electrically isolated from other conductive elements encapsulated within the sensor 100, and the third contact 124 provides access to the third electrode 120 from the topside 116 of the sensor 100. Moreover, the substrate layer 108, the first electrode, and the first layer 118 are electrically isolated from the third electrode 120 and from one another and are accessible from the topside 116 of the sensor via the fourth contact 126, the first contact 114, and the second contact, respectively The process 150 is further illustrated by reference to FIG. 1 and FIGS. 3-10. Referring initially to FIG. 3, a first silicon portion 102 is provided and processed according to blocks 152-158 to define a first electrode 112. Referring to FIG. 4, a second silicon portion 103 is provided and processed according blocks 160-162.

Figure 5:
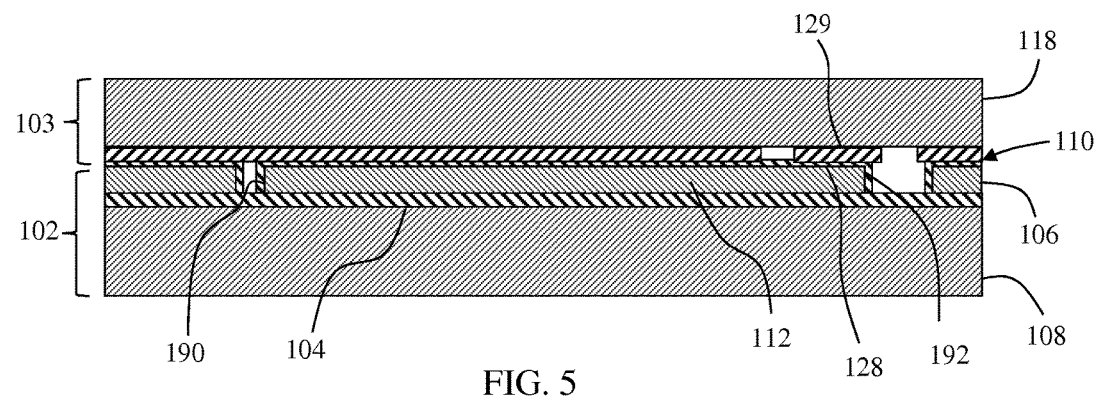
FIG. 5 depicts a side cross-sectional view of the SOI wafer and the second SOI wafer bonded together along respective oxide layers with a first electrode buried therebetween.
Figure 6:
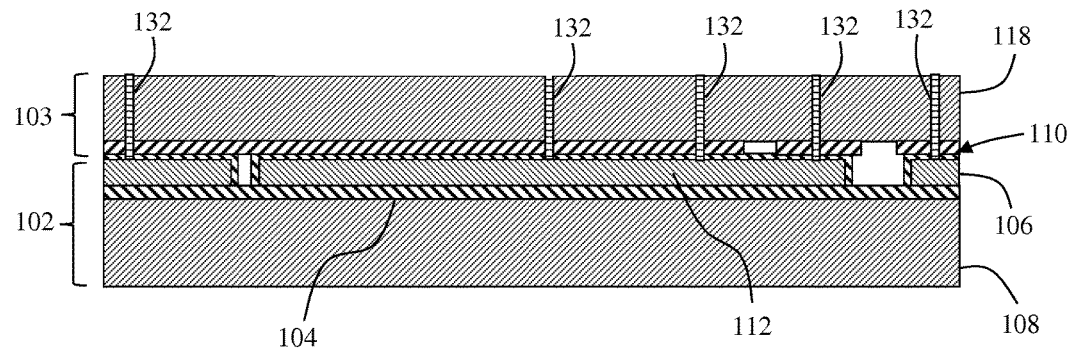
FIG. 6 depicts a side cross-sectional view of the wafer configuration of FIG. 5 with a first layer of the second SOI wafer having trenches etched and refilled with dielectric material.
Figure 7:
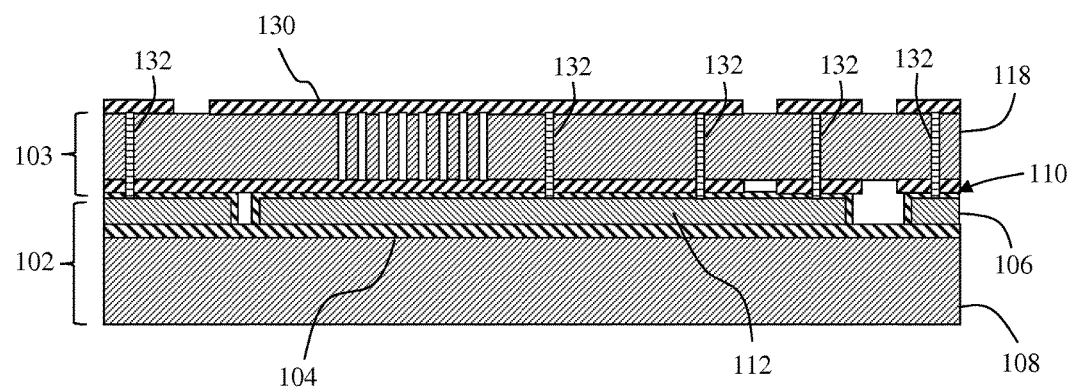
FIG. 7 depicts a side cross-sectional view of the wafer configuration of FIG. 6 showing the first layer after being patterned and covered with an oxide layer and after having the oxide layer patterned to form portions of the contacts.

FIG. 5 depicts the first and second silicon portions 102, 103 after being wafer bonded to one another to encapsulate the first electrode 112 (block 164). FIG. 6 depicts the multi-silicon stack after first trenches 132 have been etched into the first layer 118 and then refilled with a dielectric material (block 166). FIG. 7 depicts the multi-silicon stack after the first layer 118 is patterned, a second oxide layer 130 is formed on the patterned first layer 118, and the second oxide layer 130 is patterned (block 168).

Figure 8:
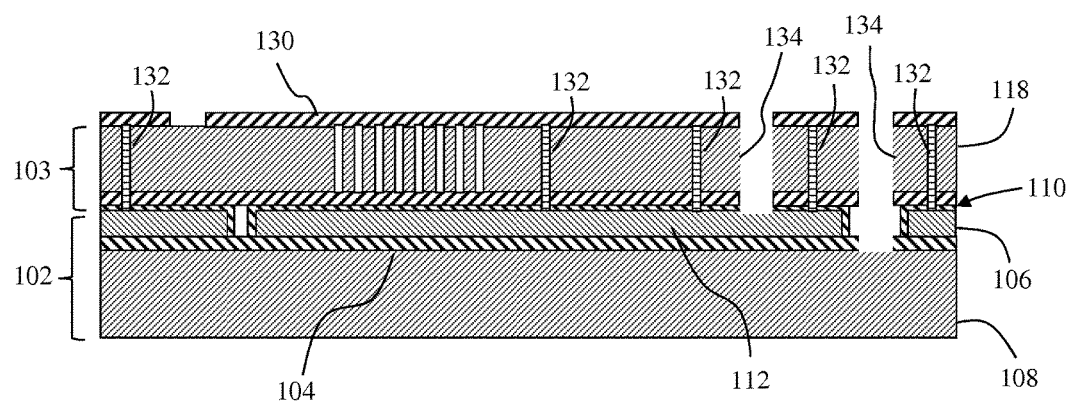
FIG. 8 depicts a side cross-sectional view of the wafer configuration of FIG. 7 after a trenching operation with an additional photomask exposes the first electrode and a substrate layer of the SOI wafer.
Figure 9:
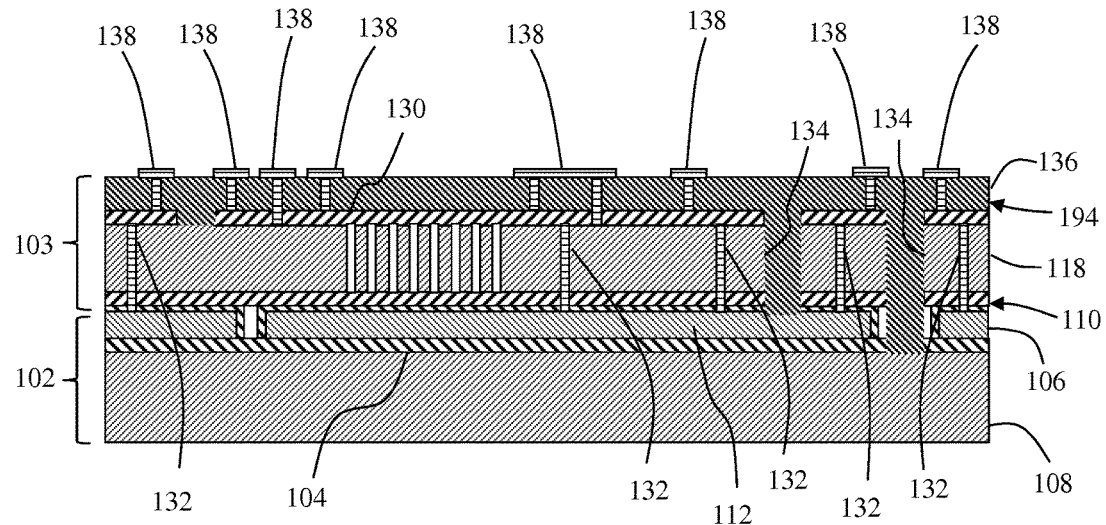
FIG. 9 depicts a side cross-sectional view of the wafer configuration of FIG. 8 with a first epitaxial portion of a second layer having trenches etched and refilled with dielectric material.

FIG. 8 depicts the multi-silicon stack after selected portions of first layer 118 are etched with an additional photomask to form second trenches 134. The second trenches 134 are formed with enough depth to extend into the first electrode 112 and the substrate layer 108 (block 170). FIG. 9 depicts the first epitaxial portion 136 of the second layer 194 of silicon that is formed on both the exposed first layer 118 and the second oxide layer 130 and that fills the second trenches 134 (block 172). Third trenches 138 are etched into the first epitaxial portion 136 and then refilled with a dielectric material, which is subsequently patterned.

Figure 10:
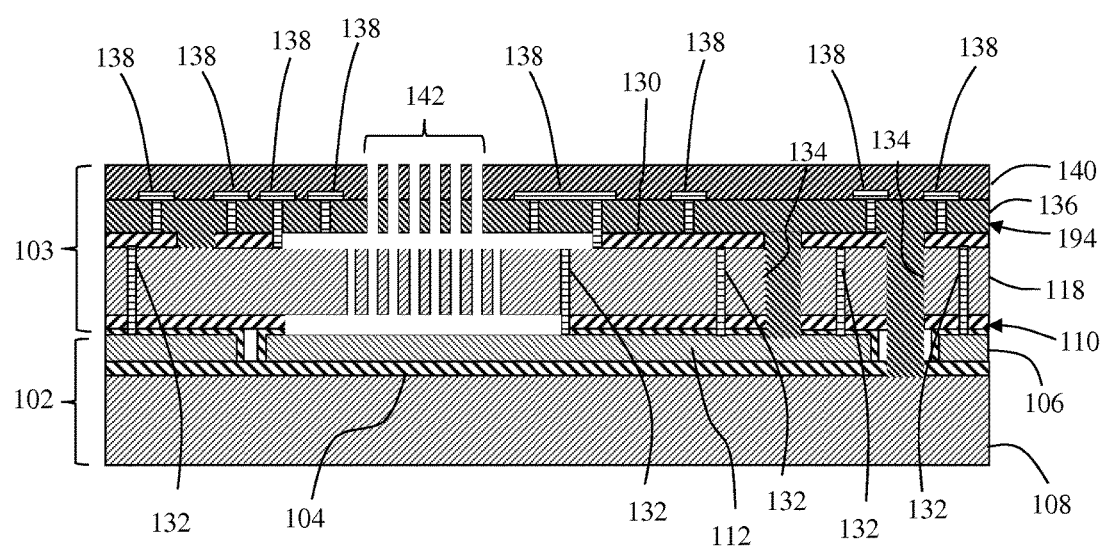
FIG. 10 depicts a side cross-sectional view of the wafer configuration of FIG. 9 with the first epitaxial portion and a second epitaxial portion of the second layer having trenches etched to expose buried oxide layers.

FIG. 10 depicts the second epitaxial portion 140 of the second layer 194 that is formed over both the first epitaxial portion 136 and the patterned dielectric material adjacent to the first epitaxial portion 136 (block 174). FIG. 10 also depicts the vent holes 142 that are etched into the first and second epitaxial portions 136, 140 to expose the second oxide layer 130 (block 176). As shown in FIG. 10, the vent holes 142 are used to release etch selected portions of the first and second oxide layers 110, 130.

FIG. 1 depicts the third epitaxial portion 144 of the second layer 194 that is formed over the second epitaxial portion 140 to seal the resulting substrate configuration. FIG. 1 also depicts the fourth trenches 146 that are etched into the second and third epitaxial portions 140, 144 after the fourth trenches 146 have been refilled with dielectric material and patterned.

The process 150 results in the sensor device 100 as illustrated in FIG. 1. The sensor device 100 has a plurality of electrically isolated vertical interconnects or contacts that provide wafer topside access to electrical elements buried within the configuration, such as the first electrode 112, the substrate layer 108, and the first layer 118. As shown in FIG. 1, the third electrode 120 is electrically isolated from other conductive elements encapsulated within the sensor 100, and the third contact 124 provides access to the third electrode 120 from the topside 116 of the sensor 100. Moreover, the substrate layer 108, the first electrode, and the first layer 118 are electrically isolated from the third electrode 120 and from one another and are accessible from the topside 116 of the sensor via the fourth contact 126, the first contact 114, and the second contact, respectively.

Figure 11:
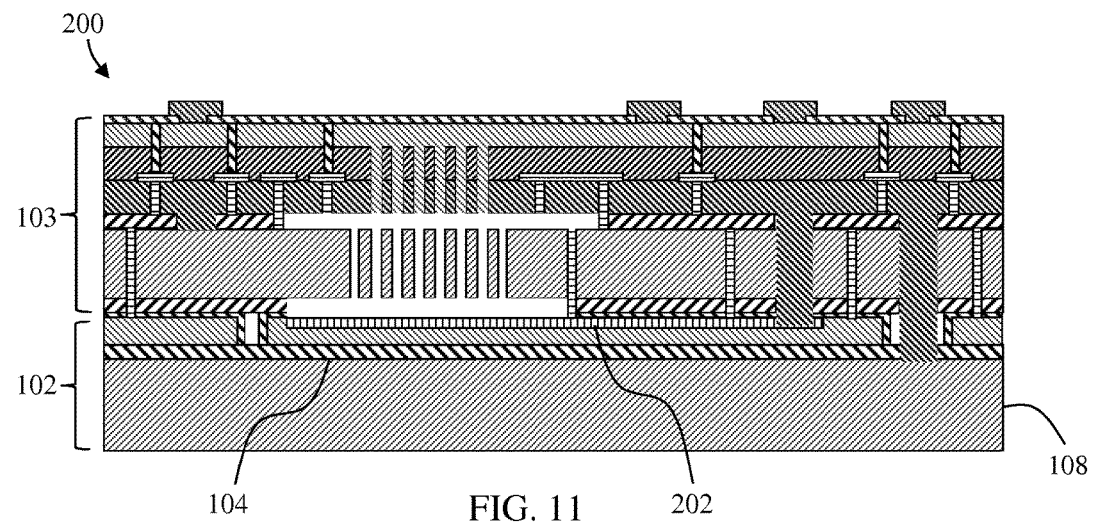
FIG. 11 depicts a side cross-sectional view of another embodiment of the sensor device of FIG. 1 with the first electrode further defined by a first highly-doped ion implanted region in the silicon layer.
Figure 12:
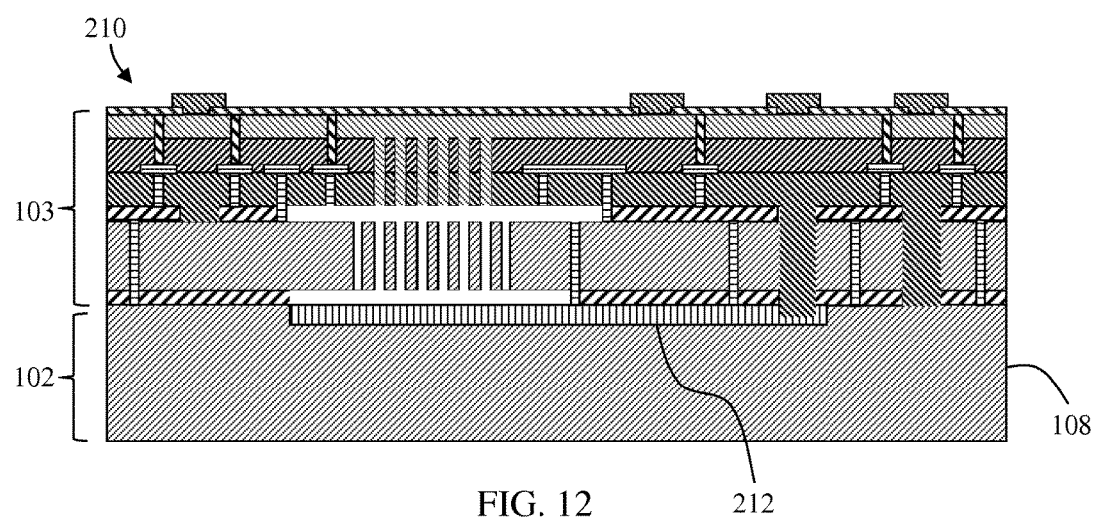
FIG. 12 depicts a side cross-sectional view of a sensor device incorporating a first electrode defined by a highly-doped ion implanted region in a silicon layer of silicon wafer.
Figure 13:
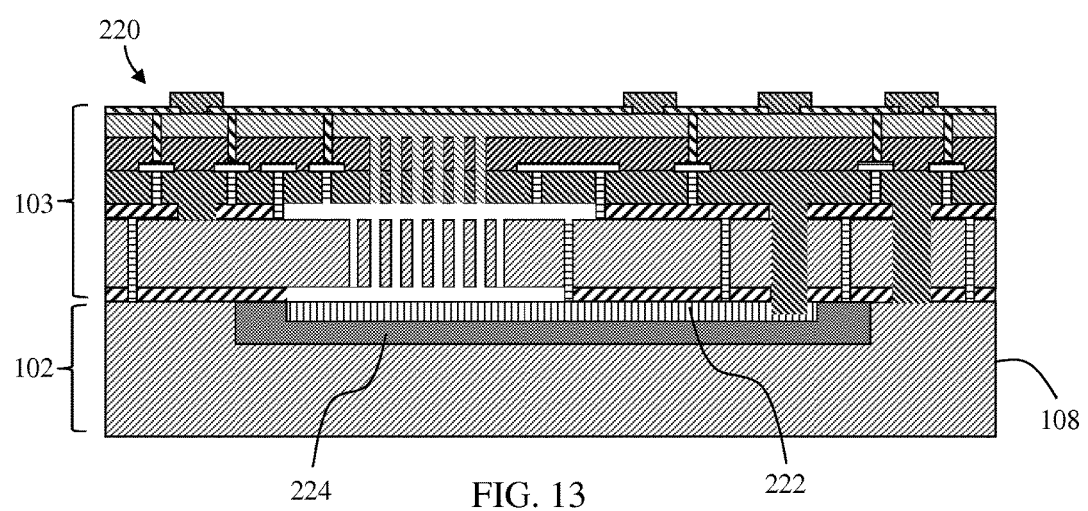
FIG. 13 depicts a side cross-sectional view of a sensor device incorporating a first electrode defined by stacking a first highly-doped ion implanted region and a second highly-doped ion implanted region in a silicon layer of a silicon wafer.

FIGS. 11-13 illustrate other embodiments of a first electrode encapsulated within a sensor in accordance with principles of the disclosure. FIG. 11 depicts a sensor 200 that includes a first electrode 202 defined after implementing a doping process. The substrate configuration of this embodiment is similar to the substrate configuration of the sensor 100 of FIG. 1 except that a doping process is used to define the first electrode 202 during the processing of the first silicon portion 102. In this embodiment, only a single doping is needed to define the first electrode 202 because the substrate layer 108 of the first silicon portion 102 is electrically isolated from the first electrode 202 via the first buried oxide layer 104.

FIG. 12 depicts a sensor 210 that includes a first electrode 212 defined after applying different doping processes to the first silicon portion 102 and the first electrode 212. In this embodiment, an buried oxide layer is not provided in the first silicon portion 102. As such, different doping of the first electrode 212 and the first silicon portion 102 provides electrical isolation between the first electrode 212 and the first silicon portion 102. In at least one embodiment, the first silicon portion 102 is P+ doped, although other doping can be used if desired. The first electrode 212 is an N+ region of the first silicon portion 102.

FIG. 13 depicts a sensor 220 that includes a first electrode 222 defined by implementing a stacked doping process. The substrate configuration of this embodiment is similar to the substrate configuration of FIG. 12 except that the first silicon portion 102 is P-type doped, a first region 224 of the first silicon portion 102 is N− doped, and a second region of the first silicon portion 102, which defines the first electrode 222, is P+ doped. The stacked doping of this substrate configuration provides electrical isolation between the first electrode 222 and the first silicon portion 102.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A method of forming a MEMS device comprising:
   defining a first electrode in a silicon portion of a first wafer;
   positioning a second wafer on an upper surface of the first wafer;
   forming a second electrode in a first layer of the second wafer, the first layer located above the upper surface of the first wafer;
   forming a third electrode in a second layer of the second wafer, the second layer located above an upper surface of the first layer;
   forming a first contact in electrical communication with the first electrode, the first contact extending through the second layer and the first layer;
   forming a second contact in electrical communication with the second electrode, the second contact extending through the second layer and electrically isolated from the first contact within the second layer; and
   defining a third contact in electrical communication with the third electrode, the third contact accessible from above the second layer.

2. The method of claim 1, wherein the second wafer is an SOI wafer, the method further comprising:
   providing a first portion of a first oxide layer over the first electrode;
   providing a second portion of the first oxide layer over the first layer; and
   connecting the first wafer and the second wafer at the respective first and second portions of the first oxide layer to electrically isolate the first electrode and the second electrode.

3. The method of claim 1, wherein the first wafer is an SOI wafer, the method further comprising:
   doping a first region of the silicon portion with a first dopant type to form a first doped region, the first doped region defining the first electrode.

4. The method of claim 1, wherein the first electrode is defined in a silicon layer of a silicon wafer that is not an SOI wafer, the method further comprising:
   doping a first region of the silicon layer with a first dopant type to form a first doped region; and
   doping a second region of the silicon layer with a second dopant type to form a second doped region, wherein the first doped region is a N+ type doped region, the second doped region is a P+ type doped region, and the first doped region and the second doped region define the first electrode.

5. The method of claim 1, wherein the first electrode is defined in a silicon layer of a silicon wafer that is not an SOI wafer, the method further comprising:
   doping a first region of the silicon layer with a first dopant type to form a first doped region;
   doping a second region of the silicon layer with a second dopant type to form a second doped region; and
   doping a third region of the silicon layer with a third dopant type to form a third doped region, the third doped region positioned between the first doped region and the second doped region, the first doped region being a P+ type doped region, the second doped region being a P type doped region, and the third doped region being a N− well type doped region, wherein the first doped region and the third doped region define the first electrode.

6. The method of claim 1, wherein the first wafer includes a buried oxide layer, the method further comprising:
   providing a first oxide layer on an upper surface of the first electrode;
   forming a functional device within the first layer;
   providing a second oxide layer on an upper surface of the first layer;
   patterning a first portion of the first oxide layer and the second oxide layer to form a first portion of the first contact;
   patterning a second portion of the first oxide layer and the second oxide layer and a portion of the buried oxide layer to form a first portion of a fourth contact, the fourth contact in electrical communication with a substrate layer located below the buried oxide layer;
   etching first trenches in the first layer and the first oxide layer; and
   filling the etched first trenches with a dielectric material to electrically isolate the first portion of the first contact and the first portion of the fourth contact within the first layer.

7. The method of claim 6, further comprising:
   etching second trenches in the first layer within the first portion of the first contact and within the first portion of the fourth contact;
   forming a first epitaxial portion of the second layer on the second oxide layer and within the second trenches;
   etching third trenches through the first epitaxial portion of the second layer to form a second portion of the first contact, a second portion of the fourth contact, and a first portion of the second contact; and
   filling the etched third trenches with the dielectric material to electrical isolate the second portion of the first contact, the second portion of the fourth contact, and the first portion of the second contact within the second layer.

8. The method of claim 7, further comprising:
   forming a second epitaxial portion of the second layer on the first epitaxial portion;
   releasing the functional device through vent holes formed in the second epitaxial portion and the first epitaxial portion; and
   forming a third epitaxial portion of the second layer on the second epitaxial portion.

9. The method of claim 8, further comprising:
   etching fourth trenches in the third epitaxial portion and the second epitaxial portion and stopping at selected ones of the etched and filled third trenches, the etched fourth trenches forming a third portion of the first contact, a third portion of the fourth contact, a second portion of the second contact, and a first portion of the third contact; and
   filling the etched fourth trenches with the dielectric material to electrically isolate the third portion of the first contact, the third portion of the fourth contact, the second portion of the second contact, and the first portion of the third contact within the second layer.

10. The method of claim 9, further comprising:
forming a passive layer on the third epitaxial portion of the second layer;
patterning portions of the passive layer to expose portions of the third epitaxial portion corresponding to the third portion of the first contact, the third portion of the fourth contact, the second portion of the second contact, and the first portion of the third contact;
forming a metal layer on the patterned passive layer; and
patterning the metal layer to electrically isolate the first contact, the second contact, the third contact, and the fourth contact above the second layer.

11. The method of claim 8, wherein the first epitaxial portion, the second epitaxial portion, and the third epitaxial portion are deposited by an epitaxial deposition process.

12. The method of claim 6, wherein the dielectric material includes at least one of silicon dioxide, silicon nitride, and ALD alumina.

13. A MEMS device, comprising:
a first electrode in a silicon portion of a first wafer;
a second electrode in a first layer of a second wafer attached to the first wafer and located above an upper surface of the first wafer;
a third electrode in a second layer of the second wafer and located above an upper surface of the first layer;
a first contact in electrical communication with the first electrode, the first contact extending through the second layer and the first layer;
a second contact in electrical communication with the second electrode, the second contact extending through the second layer and electrically isolated from the first contact within the second layer; and
a third contact in electrical communication with the third electrode, the third contact accessible from above the second layer.

14. The device of claim 13, wherein the first electrode is defined in a first doped region of the first wafer, the first doped region including a first dopant type.

15. The device of claim 13, wherein the first electrode is defined in a silicon layer of a silicon wafer that is not an SOI wafer, the silicon layer including:
a doped first region of a first dopant type; and
a doped second region of a second dopant type, the first doped region being a N+ type doped region and the second doped region being a P+ type doped region, the first doped region and the second doped region defining the first electrode.

16. The device of claim 13, wherein the first electrode is defined in a silicon layer of a silicon wafer that is not an SOI wafer, the silicon layer including:
a doped first region of a first dopant type;
a doped second region of a second dopant type; and
a doped third region of a third dopant type, the third doped region positioned between the first doped region and the second doped region, the first doped region being a P+ type doped region, the second doped region being a P type doped region, and the third doped region being a N− well type doped region, wherein the first doped region and the third doped region define the first electrode.

17. The method of claim 1, wherein:
the second electrode is formed so as to be positioned at least partially directly above the first electrode; and
the third electrode is formed so as to be positioned at least partially directly above the second electrode.

18. The device of claim 13, wherein:
the second electrode is positioned at least partially directly above the first electrode; and
the third electrode is positioned at least partially directly above the second electrode.

* * * * *